United States Patent [19]

Niwa et al.

[11] 4,237,606
[45] Dec. 9, 1980

[54] METHOD OF MANUFACTURING MULTILAYER CERAMIC BOARD

[75] Inventors: Koichi Niwa, Tama; Teruo Murase, Tokorozawa; Masatoshi Fujimori, Musashino; Kyohei Murakawa, Yokohama, all of Japan

[73] Assignee: Fujitsu Limited, Kawasaki, Japan

[21] Appl. No.: 933,073

[22] Filed: Aug. 11, 1978

Related U.S. Application Data

[63] Continuation of Ser. No. 823,650, Aug. 11, 1977, abandoned.

[30] Foreign Application Priority Data

Aug. 13, 1976 [JP] Japan .................................. 51-96742

[51] Int. Cl.³ .............................................. H05K 3/36
[52] U.S. Cl. ........................................ 29/830; 174/68.5
[58] Field of Search .................. 29/625, 626, 577, 830; 339/17 B, 17 M; 264/61; 174/68.5; 427/98

[56] References Cited

U.S. PATENT DOCUMENTS

| | | | |
|---|---|---|---|
| 3,332,137 | 7/1967 | Kenney | 29/577 |
| 3,726,002 | 4/1973 | Greenstein et al. | 174/68.5 |
| 3,772,748 | 11/1973 | Rutt | 29/625 X |
| 3,798,762 | 3/1974 | Harris et al. | 29/626 |
| 3,948,706 | 4/1976 | Schmeckenbecher | 29/625 X |
| 3,968,193 | 7/1976 | Langston, Jr. et al. | 264/61 |
| 3,999,004 | 12/1976 | Chirino et al. | 29/625 X |
| 4,024,629 | 5/1977 | Lemoine et al. | 29/625 |
| 4,030,004 | 6/1977 | Rutt | 264/61 X |

FOREIGN PATENT DOCUMENTS

| | | | |
|---|---|---|---|
| 4973086 | of 1976 | Japan | 29/625 |
| 1254101 | 11/1971 | United Kingdom | 264/61 |

OTHER PUBLICATIONS

IBM Tech Discl Bull, vol. 13, No. 7, Dec. 1970, P 1882.

Primary Examiner—Francis S. Husar
Assistant Examiner—C. J. Arbes
Attorney, Agent, or Firm—Daniel Jay Tick

[57] ABSTRACT

In a method of manufacture of a multilayer ceramic board, a conductor land is formed and baked on a first substrate. A second substrate on which the wiring pattern is formed is then electrically connected to the first substrate via the land. An error in the substrate due to shrinkage at the time of sintering is thereby compensated by the conductor land. This assures the formation of a highly accurate wiring pattern on the sintered substrate surface, despite shrinkage of the ceramic during sintering of the raw sheets of ceramic.

15 Claims, 18 Drawing Figures

METHOD OF MANUFACTURING MULTILAYER CERAMIC BOARD

This is a continuation of application Ser. No. 823,650, filed Aug. 11, 1977, now abandoned.

BACKGROUND OF THE INVENTION

The present invention relates to a multilayer ceramic board and a method of manufacture of same. More particularly, the invention relates to a method of manufacture of a ceramic plate in which the conductive wiring pattern is formed via the layers and to the structure of such ceramic board.

When a device having the desired functions is manufactured, an electronic part such as, for example, a microminiature device, is mounted on a substrate and wiring is then provided. The substrate may comprise a multilayer substrate utilizing resin such as, for example, epoxy resin, as the main material, or utilizing ceramic material of $Al_2O_3$ and $MgO$, etc, as the main material. Such substrates are currently well known. A substrate using ceramic material has excellent thermal characteristics such as heat proof characteristics, as compared with resin. Furthermore, ceramic has greater electrical insulative characteristics and greater electrical resistance than a substrate utilizing resin as the main material. For this reason, ceramic material is often used as a substrate or carrier for mounting electrical devices such as beam lead devices, microminiature devices, etc, which require minute wirings. The conventional multilayer ceramic board or carrier may be manufactured by the following process.

Ceramic powder such as alumina is subjected to milling together with a solvent to provide a slip. The slip is placed flat on a plastic film, using a doctor blade. The slip is then dried, thereby providing an unsintered ceramic plate or a green sheet. A pattern is printed on the green sheet according to a wiring pattern, by using electrically conductive paste in which electrically conductive powders such as Mo and W are mixed. At such time, a hole is made at a specified position on the green sheet, if necessary. The hole is then filled with the electrically conductive paste.

Several boards obtained by the aforedescribed process are laminated with the desired wiring patterns positioned mutually face to face. The wiring patterns are electrically connected via through holes, which are then filled with the electrically conductive paste as a conductor. The laminated green sheets are fired under optimum firing temperature for producing a dense ceramic.

When ceramic is used as the board material in the conventional method of manufacture, however, shrinkage of laminated green sheets occurs during the firing step. This influences the positioning accuracy of the wiring pattern of the board. Thus, for example, when firing shrinkage is kept within a deviation of ±0.5%, a displacement of about 250 microns or $\mu$ will occur at the edge of a board 100×100 mm, considering the origin of contraction at the center of the substrate. When the deviation is ±0.3%, the displacement is approximately 150$\mu$.

When the substrate is small in size, and the pattern density is low, and the pattern is formed with a clearance at least longer than the aforementioned "displacement", it is possible to alleviate pattern displacement due to shrinkage caused at the time of sintering by providing conductor land which is wider than the wiring pattern on the substrate in face to face arrangement with the hole and terminals. Therefore, no practical problem arises in mounting the elements. However, when the circuit substrate is of high density and the pattern clearance is 250$\mu$ or less, mounting of an element and connection with an external substrate become impossible due to displacement resulting from shrinkage.

In general, electrical connection between the layers of the multilayer ceramic board is provided via the through holes. The problem of displacement can be solved by making the land diameter of the through hole large. Practically, however, the substrate surface is covered primarily with elements mounted thereon or space for external connection terminals, so that wiring must often be provided between lands. For this reason, the land diameter is restricted by the pattern density. In other words, in a high density circuit substrate, deviation of shrinkage due to firing governs the density of the pattern, etc.

From the foregoing point of view, the conventional method of manufacture of a multilayer ceramic board may be said to have a drawback sufficient to prevent the preparation of a high density circuit substrate.

The principal object of the invention is to provide a method of manufacture of a multilayer ceramic board having fine wiring patterns on its surface.

An object of the invention is to provide a method of manufacture of a multilayer ceramic board utilizing few and simple steps.

Another object of the invention is to provide a method of manufacture of a multilayer ceramic board wherein two ceramic boards or circuit substrates are laminated and the continuity of patterns formed on each surface is established by simple steps.

BRIEF SUMMARY OF THE INVENTION

As utilized herein, "a ceramic plate" is intended to mean "a fired ceramic plate" and a "a green sheet" is intended to mean "an unfired ceramic sheet". A "reverse pattern" is composed of an insulating material such as, for example, a green sheet. It is intended to make the surface of the green sheet flat by printing a reverse pattern around a conductive pattern.

In accordance with the invention, a method of manufacture of a multilayer board having a fine wiring pattern on its surface and internal multilayered wiring comprises the steps of forming a hole in a first ceramic plate which has been fired, forming a land layer devoid of wiring patterns, except the land, which is large enough to compensate for shrinkage due to firing on the surface of a second unfired ceramic plate having internal mutlilayered wiring, the land being formed at a position corresponding to the position of the through hole in the first ceramic plate, laminating the first and second ceramic plates, and electrically connecting the through hole of the first ceramic plate to the land of the second ceramic plate.

The method of manufacture of a multilayer ceramic board further comprises the steps of providing a multilayered ceramic green sheet having a surface, forming a through hole through the green sheet, and providing a conductive land on the surface of the multilayered ceramic green sheet to provide the second unfired ceramic plate.

The method of manufacture of a multilayer ceramic board further comprises the steps of applying an electrically conductive paste to the surface of the ceramic green sheet, printing the electrically conductive paste to form the wired layer, and forming a layer having the through hole on the wired layer alternately to provide the multilayered ceramic green sheet.

The method of manufacture of a multilayer ceramic board further comprises the steps of applying an electrically conductive paste to the surface of the multilayered ceramic green sheet, printing a predetermined land pattern on the conductive paste, and firing the ceramic green sheet and the predetermined land pattern of electrically conductive paste on the surface thereof to provide the conductive land.

The method of manufacture of a multilayer ceramic board further comprises the steps of firing the multilayered ceramic green sheet, applying an electrically conductive paste to the surface of the multilayered ceramic green sheet after firing, and printing a predetermined land pattern on the conductive paste to provide the conductive land.

The method of manufacture of a multilayer ceramic board further comprises the steps of providing a plurality of ceramic green sheets each having a surface, a wiring layer of a predetermined pattern on the surface and a through hole in the surface, printing a conductive pattern on the ceramic green sheets, and printing a reverse pattern to the conductive pattern, consisting of insulating material, on the ceramic green sheets to provide a dielectric pattern. A reverse pattern is defined as a build-up of insulating material on the surface of the ceramic green sheets surrounding the conductive pattern such that the surface which includes the top of the insulating material and the top of the conductive pattern is flat and continuous.

The method of manufacture of a multilayer ceramic board further comprises the steps of providing a glass layer on the second fired ceramic plate, laminating the fired ceramic plate and the second first ceramic board to provide a laminated plate, and melting the glass layer.

The method of manufacture of a multilayer ceramic board further comprises the step of providing the glass layer with a thickness greater than that of the conductive land on the second fired ceramic plate.

The method of manufacture of a multilayer ceramic board further comprises the steps of providing the glass layer with a thickness greater than that of the conductive land on the second fired ceramic plate, providing a ceramic green sheet as the first ceramic plate, melting the glass layer, and heating the wiring plate at firing temperature to integrate the fired ceramic plate and the second wiring plate.

The method of manufacture of a multilayer ceramic board further comprises the steps of providing the glass layer with a thickness greater than that of the conductive land on the second fired ceramic plate, the first ceramic plate being the fired ceramic plate, and heating the glass layer at a temperature sufficient to soften it to provide a laminated fired ceramic board.

The method of manufacture of a multilayer ceramic board further comprises the steps of providing a glass layer on the second fired ceramic plate, etching the glass layer with the first ceramic plate having the hole therein used as a mask, filling the hole formed in the first ceramic plate with electrically conductive paste to provide a laminated fired ceramic board.

The method of manufacture of a multilayer ceramic board further comprises the steps of providing a glass layer on the second fired ceramic plate with a thickness equal to that of the conductive land on the second fired ceramic plate, laminating the first ceramic plate with the second fired ceramic plate, and melting the glass layer to provide a laminated fired ceramic board.

The method of manufacture of a multilayer ceramic board further comprises the steps of providing a glass layer on the second fired ceramic plate with a thickness equal to that of the conductive land of the second ceramic plate, laminating the first ceramic plate and the second fired ceramic plate having the holes therein with the holes positioned in face to face relation with the conductive land, filling electrically conductive paste in the holes to electrically connect the second fired ceramic plate to the first ceramic plate, heating the laminated ceramic plate, and firing the electrically conductive paste to melt the glass layer and to provide a laminated fired ceramic board.

The method of manufacture of a multilayer ceramic board further comprises the steps of providing an unfired ceramic green sheet having holes as the first ceramic plate, providing a glass layer on the second fired ceramic plate with a thickness equal to that of the conductive land on the second fired ceramic plate, laminating the second fired ceramic plate with the glass layer and the ceramic green sheet to provide a laminated fired ceramic board, filling electrically conductive paste in the holes formed in the laminated plate to electrically connect the second fired ceramic plate and the ceramic green sheet heating the plate with the electrically conductive paste in the holes thereof to the firing temperature of the ceramic green sheet, and simultaneously firing the ceramic green sheet, the electrically conductive paste and the glass layer.

The method of manufacture of a multilayer ceramic board further comprises the steps of providing a ceramic green sheet having holes plate, providing the ceramic green sheet on the second fired ceramic plate, and heating the plate on which the ceramic green sheet is formed to the firing temperature of the ceramic green sheet to provide a laminated fired ceramic board.

In accordance with the invention, a multilayer ceramic board comprises a fired ceramic plate having a surface and a plurality of conductive lands on the surface, a wiring plate on the surface of the ceramic plate, the wiring plate having a surface and through holes formed in the surface in contact with the conductive land, and a wiring pattern in the ceramic plate connected to the holes formed in the surface of the wiring plate.

The multilayer ceramic board further comprises a plurality of wiring patterns formed inside the ceramic plate and a plurality of through holes formed in the ceramic plate connecting the wiring patterns and extending between the conductive lands and the wiring patterns.

The conductive lands are of circular configuration and are coaxial with corresponding ones of the through holes formed in the wiring plates.

The conductive lands are of circular configuration and are coaxial with corresponding ones of the through holes formed in the ceramic plate.

BRIEF DESCRIPTION OF THE DRAWINGS:

In order that the invention may be readily carried into effect, it will now be described with reference to the accompanying drawings, wherein.

Figure 1:
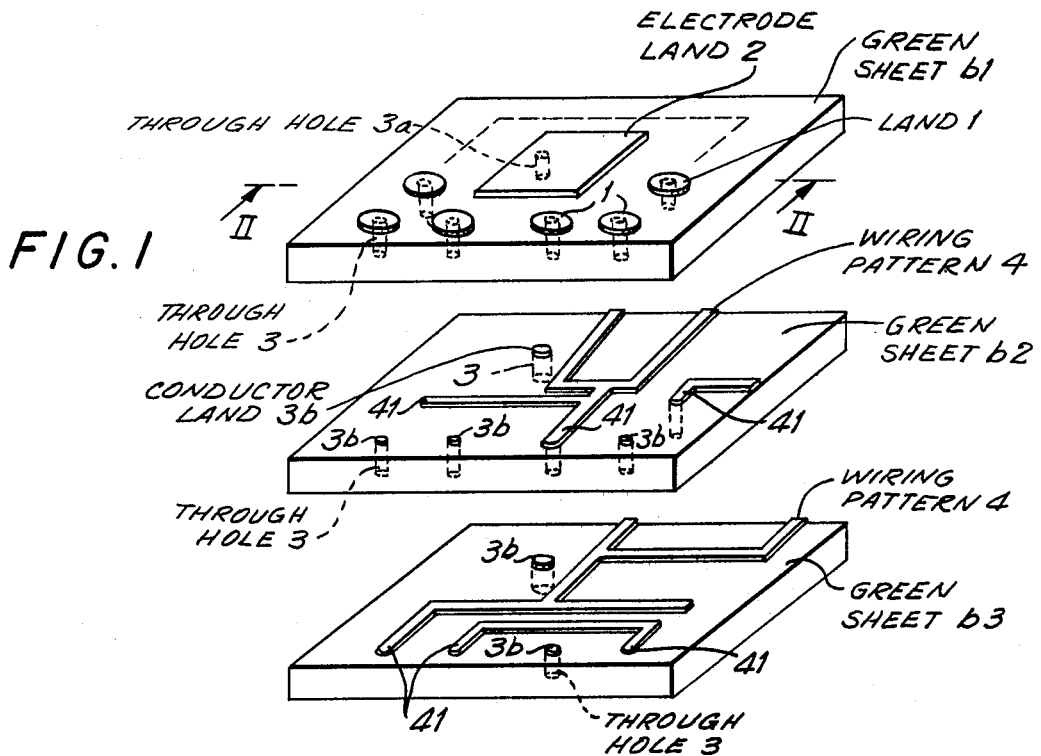
FIG. 1 is an exploded perspective view of embodiments of multilayer ceramic plates of the ceramic board of the invention.

DETAILED DESCRIPTION OF THE INVENTION:

Green sheets b1, b2 and b3 are provided in FIG. 1. The green sheet b1 has land 1 projecting therefrom, electrode land 2 projecting therefrom and through holes 3. The green sheets b2 and b3 also have through holes 3 and have wiring patterns 4.

Each green sheet b1, b2 and b3 may be formed by the following process. First, $Al_2O_3$ and $MgO$ powder is mixed into a well known binder to provide a slip. The slip is then run on polyester film and its surface is flattened by a doctor blade. After the slip is dried, a hole is formed in the dry green sheet at the position where the conductor land 1 and the electrode land 2 are formed by a succeeding process. The hole is filled with an electrically conductive paste of mixed metallic powder. Through holes 3 and 3a are thus provided.

The conductor land 1 on the green sheet b1 having the through holes 3 and 3a is of a size dependent upon the wiring density amd the electrode land 2 for grounding by electrical connection plates having a ground electrode on the rear surface, as in the case of a beam lead device. These are provided by a screen printing method or other method such as, for example, a plasma jet method, etc, using the electrically conductive paste of mixed metallic powder. The wiring pattern 4 is formed on the green sheets b2 and b3 by the screen printing method, using the electrically conductive paste.

The wiring pattern 4 is to be connected tothe through hole and is formed so that the pattern is partially printed at a position 41 facing the through hole 3 of green sheet b1 on the green sheet b2, or on the position 41 facing a through hole of the green sheet b2 on the green sheet b3. Furthermore, when wiring is not provided on the green sheet b2 or the green sheet b3 and when the wiring pattern on a green sheet other than the green sheet b2 or b3 is connected via the conductor land 1 on the green sheet b1 and a through hole, the wiring pattern 4 is printed. A conductor land 3b is simultaneously printed at the position of a through hole 3 at which a wiring pattern is not printed on either green sheet b2 and b3, respectively.

Figure 2:
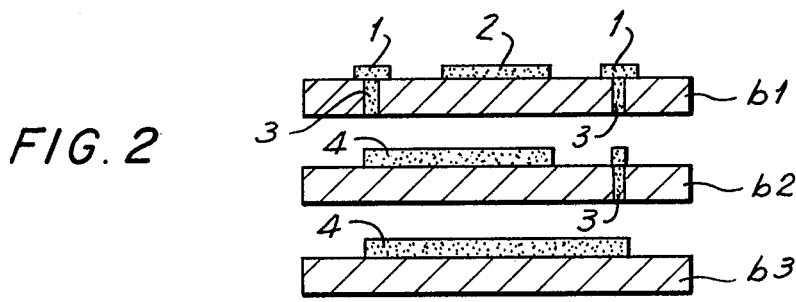
FIG. 2 is a cross-sectional view, taken along the lines II—II, of FIG. 1.

FIG. 2 is a cross-sectional view, taken along the lines II—II, of FIG. 1. In order to smoothen the wiring pattern surfaces formed on the green sheets b2 and b3, shown in FIG. 2 and provided as hereinbefore described, the pasted ceramic is screen printed on said green sheets with the pattern reversed to the wiring pattern 4.

Figure 3:
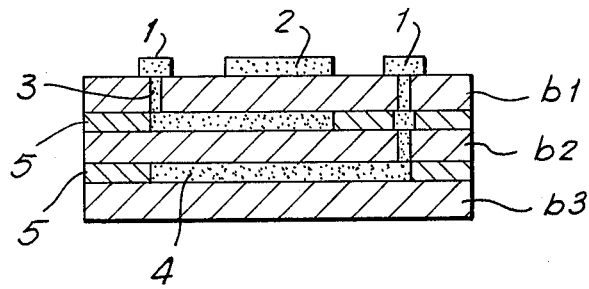
FIG. 3 is a cross-sectional view of the multilayer ceramic board of FIG. 2 after lamination.

In FIG. 3, the green sheets b1, b2 and b3, formed as shown in FIG. 2, and having surfaces smoothened by the use of pasted ceramic, are laminated under pressure. If a green sheet of the same configuration as that of FIG. 3 is produced by the screen printing method in FIG. 4, the wiring pattern 4 is at first formed on a ceramic green sheet b4 by a printing method. A wiring layer 51 is formed with a wiring pattern and a non-conductive pattern by printing ceramic paste of an opposite or reverse pattern on the wiring pattern. The electrically conductive paste is then printed at the position of the through hole 3. A through hole layer 52 is formed after the printing of the ceramic paste of the opposite or reverse pattern. A wiring layer 53 and a through hole layer 54 are formed by repetition of the aforedescribed process, and the conductor land 1 and the electrode land 2 are formed on the surface of the through hole layer 54.

Figure 4:
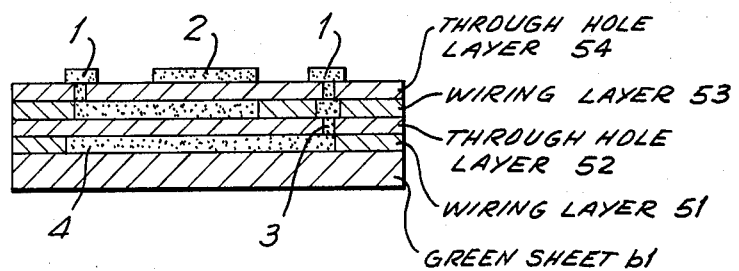
FIG. 4 is a cross-sectional view of the multilayer ceramic board of FIG. 2 after lamination by the printing method.
Figure 5:
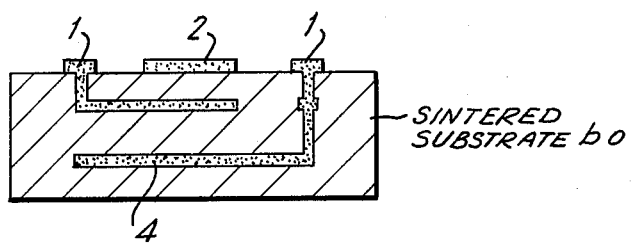
FIG. 5 is a cross-sectional view of the multilayer ceramic board of FIG. 3 after sintering.

The laminated green sheet shown in FIG. 3 or FIG. 4 is heated once at a temperature sufficient to sublimate the solventof the green sheet or the electrically conductive paste and is then sintered at a temperature necessary to provide a high density of ceramic material to provide the multilayer ceramic board of FIG. 5. Each green sheet and each layer of the ceramic board of FIGS. 3 and 4 are thereby integrated into the unit of FIG. 5, and thus a sintered substrate bo is obtained. The wiring pattern 4 of the substrate bo thus obtained does not include solvent and is of solid type.

Figure 6:
FIG. 6 is a cross-sectional view of a ceramic board for wiring a conductive pattern on the surface.

The substrate ao of FIG. 6 is a flat, smooth ceramic for mounting semiconductor devices. The substrate ao is provided at the front and rear surfaces of the multilayer substrate bo shown in FIG. 5. Holes 6 are drilled accurately with laser beams, etc, under numerical control, for the purpose of electrical connection with the conductor land 1 of the substrate bo shown in FIG. 5.

Figure 7:
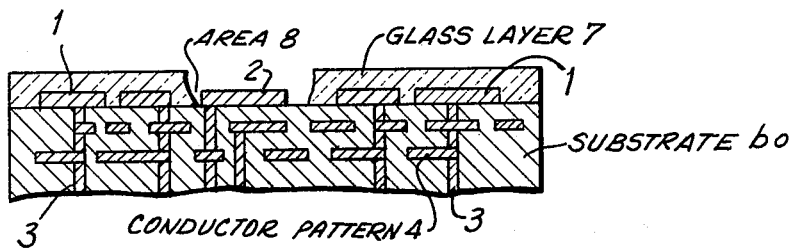
FIGS. 7, 8 and 9 are cross-sectional views of a multilayer ceramic board after different steps in the method of the invention.

On the other hand, in FIG. 7, the ceramic plate bo is a multilayer substrate in the inside of which the conductor pattern 4 is already formed. The land 1 has a desired diameter and is formed on the front and rear surfaces of the substrate before or after sintering, as hereinbefore mentioned. The glass layer 7 is then coated on the substrate.

If it is necessary to die bond an element directly to the substrate bo via the electrode land 2, there is no need to coat the glass layer 7 on the area 8. It is also necessary to provide a window 61 on the element of the substrate ao in FIG. 6.

Figure 8:
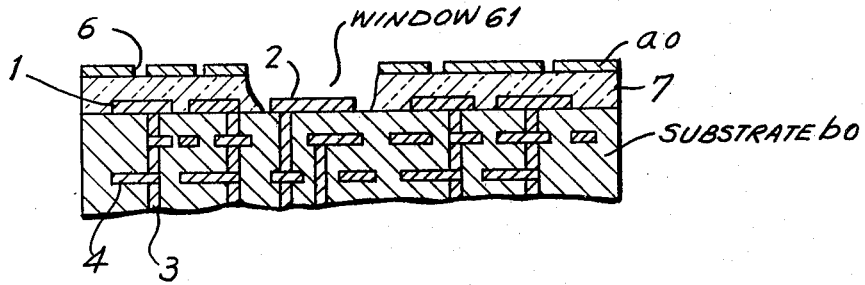
Figure 9:
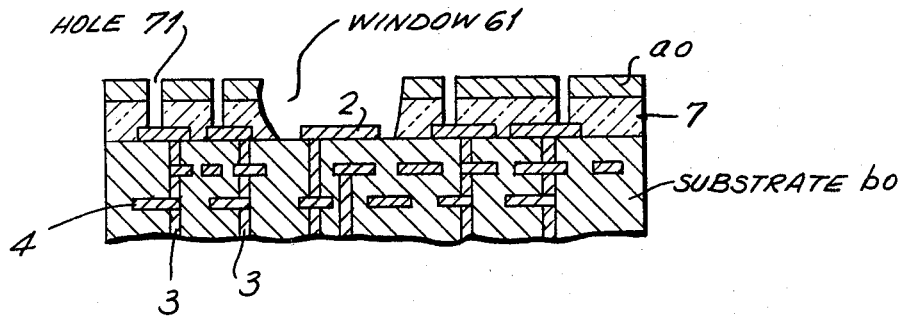

The substrate ao is placed on the substrate bo, as shown in FIG. 8, and the substrates are heat treated under conditions which integrate them perfectly into one unit, at a temperature higher than that for softening the glass layer 7. The board integrating the substrates ao and bo is dipped into an etching fluid of glass. The glass layer 7 is then drilled, as shown in FIG. 9. The drilling of the glass coating is completed with the dipping into the etching fluid, since the substrate ao itself functions as an etching mask.

Figure 10:
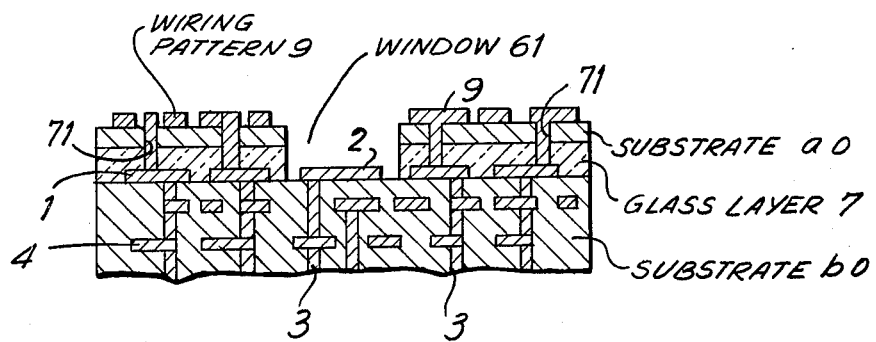
FIG. 10 is a cross-sectional view of the multilayer ceramic board of FIG. 9 after wiring.

When the exposed area at the end of the substrate and glass coating of the element mounting area becomes a problem, an etching resist, or the like, of resin may be used. A through hole 3 is then provided by making a drilled hole 71 in FIGS. 9, 10 and 11 conductive. A fine wiring pattern 9 is provided on the front and rear surfaces of the substrate. The multilayer ceramic board is thereby provided. When fewer elements are mounted on the substrate bo by die bonding, the diameter of the conductor land 1 may be made large.

Figure 11:
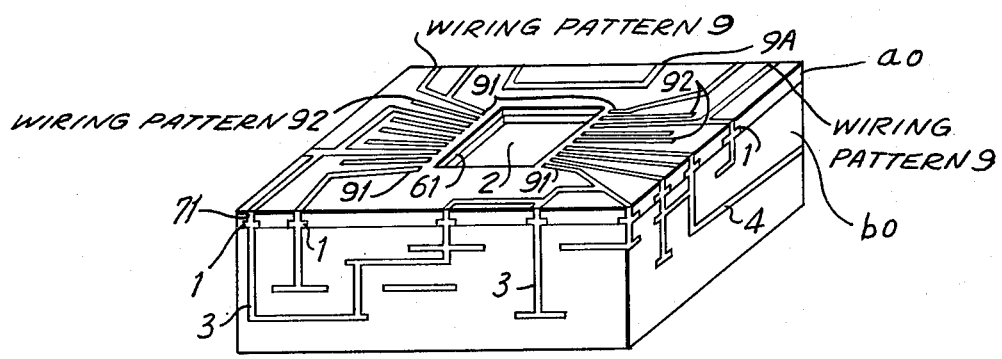
FIG. 11 is a perspective view of an embodiment of a complete multilayer ceramic board of FIG. 10.

FIG. 11 is a perspective view of the finished multilayer ceramic board of the invention. In FIG. 11, the wiring pattern 9 is provided by vacuum evaporation and etching, etc, on the substrate ao. The end of the wiring pattern 9 is arranged in detail so that the plurality of electrodes on the surface of the beam lead device are individually connected when the ground terminal at the base of the beam lead device is connected to the electrode land 2 on the substrate bo. A wiring pattern 92 is connected to the conductor land 1 via the through hole 71 of the substrate ao before being wired to the other element on the substrate.

In the foregoing explanation, the substrate or ceramic board ao shown in FIG. 6 is described as a sintered board, although it is obvious that it may be a green sheet. In such case, the green sheet must be a low melting point ceramic which may be sintered at a temperature around the softening point of the glass layer 7 when it is integrated with the substrate using said glass layer of FIG. 8 with less shrinkage due to the sintering.

Furthermore, when a glass layer for affixing the substrate ao to the substrate bo is provided at a thickness equal to that of the land on the substrate bo, the drilling process of the glass layer shown in FIG. 9 may be eliminated. In addition, when the glass layer 7 is provided in the aforedescribed manner and a green sheet is used as the substrate ao, a multilayer ceramic board may be obtained by sintering the green sheet at its sintering temperature.

Figure 12A:
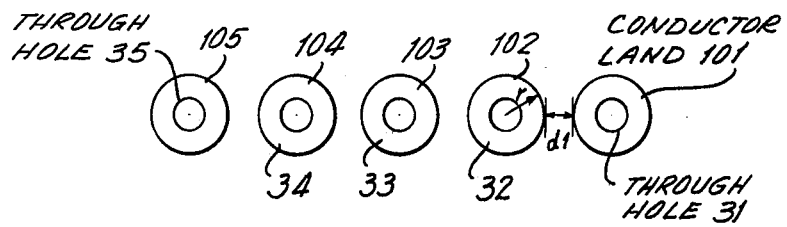
FIGS. 12a, 12b, 12c, 12d, 12e, 12f and 12g are schematic diagrams explaining the relation in position of a ceramic plate having a conductive pattern thereon and the multilayer ceramic board shown in FIG. 9.

FIG. 12a shows the positional relation between the conductor land 1 formed on the green sheet b1 of FIG. 1 and the through hole 3 formed on said green sheet b1. In FIG. 12a, conductor lands 101, 102, 103, 104 and 105 are provided on the through holes 31, 32, 33, 34 and 35, respectively. If an unsintered green sheet is used as the ceramic material, the through holes 31, 32, 33, 34 and 35 are formed by punching through the green sheet. The through holes 31, 32, 33, 34 and 35 provided by filling such holes with electrically conductive paste are also formed with equal clearance. Furthermore, since the conductor lands 101, 102, 103, 104 and 105 on the through holes 31, 32, 33, 34 and 35 may be produced by screen printing, electrically conductive paste with a clearance d1 (FIG. 12a), for example, they may also be formed with the same clearance.

In FIG. 12a, the conductor lands 101, 102, 103, 104 and 105 are formed as circles having a radius r and concentric and coaxial with the through holes 31, 32, 33, 34 and 35. The conductor lands may be of a different geometrical configuration such as, for example, rectangular or elliptical, etc. When the direction of shrinkage or displacement due to sintering is obvious, the width of the conductor land in a direction perpendicular to the direction of shrinkage may be narrowed by shaping the conductor land as an ellipse or rectangle having a longer axis, thereby increasing the density of the conductor land on the green sheet.

Figure 12B:
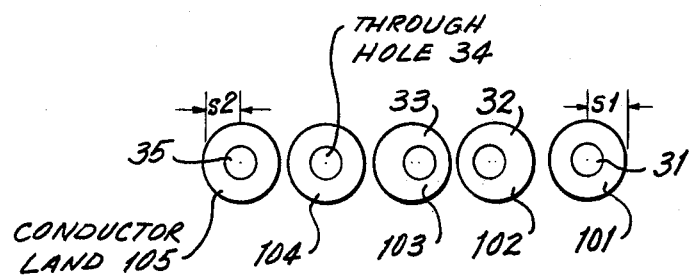

FIG. 12b shows the positional relation of the conductor land 1 and the through hole after the green sheet with the land shown in FIG. 12a is sintered. Each conductor land 101, 102, 103, 104 and 105 in FIG. 12b shows shrinkage in the direction of the conductor land 103. This shrinkage is as great as the conductor land on the outer substrate at the center of the conductor land 103.

Figure 12C:
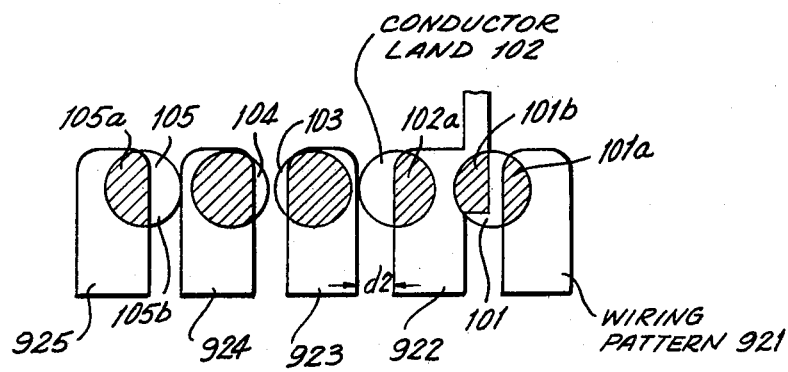

Conventionally, wiring patterns 921, 922, 923, 924, 925 are formed by the screen printing or vacuum evaporation, as shown in FIG. 12c on the conductor lands 101, 102, 103, 104 and 105, on a substrate shrunk as shown in FIG. 12b. Each wiring pattern becomes conductive via the conductor land in such area where a shift s2 of conductor land shown in FIG. 12b due to the shrinkage width of the substrate or a shift s1 of the conductor land is greater than the clearance d2 between wiring patterns (FIG. 12c).

As shown in FIG. 12c, the wiring pattern 924 and the conductor land 105 are connected via a hatched area 105a. Furthermore, the conductor land 105 contacts with the wiring pattern 924 in an area 105b. A wiring pattern 922, different in shape from the wiring patterns 921, 923, 924 and 925, also contacts the conductor land 101 and is connected only to the adjacent wiring pattern 921 in an area 101b. The wiring patterns 921 and 922 are electrically connected via the area 101a, the conductor land 101 and the area 101b.

Figure 12D:
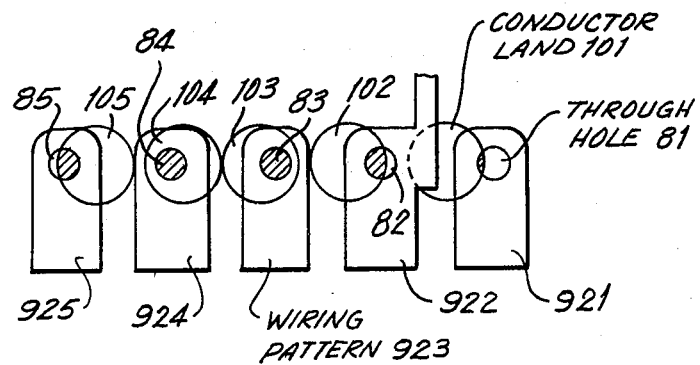

In the ceramic board of the invention, as shown in FIG. 12d, holes are drilled at specified positions shown in FIG. 6. More particularly, the holes are drilled at the positions corresponding to the through holes 31, 32, 33, 34 and 35 shown in FIG. 12a on the substrate on which the wiring patterns 921, 922, 923, 924 and 925 are formed. Then the through holes 81, 82, 83 84 and 85 (FIG. 12d) are formed. The wiring patterns 921, 922, 923, 924 and 925 provided on the substrate are connected to the conductor lands only in the hatched areas of FIG. 12d, even if the conductor land shifts due to shrinkage as a result of sintering, so that termination is unsuccessful.

Figure 12E:
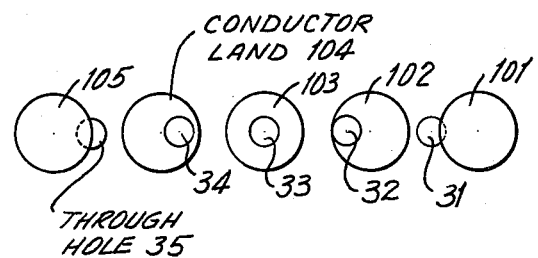
Figure 12F:
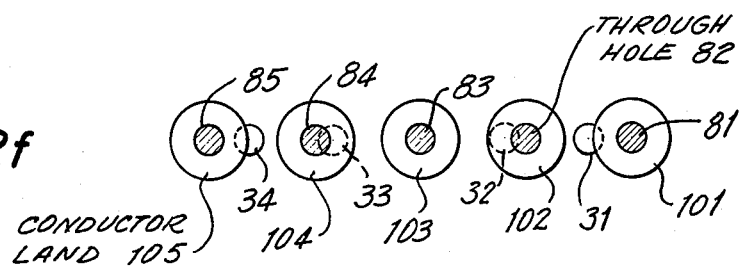
Figure 12G:
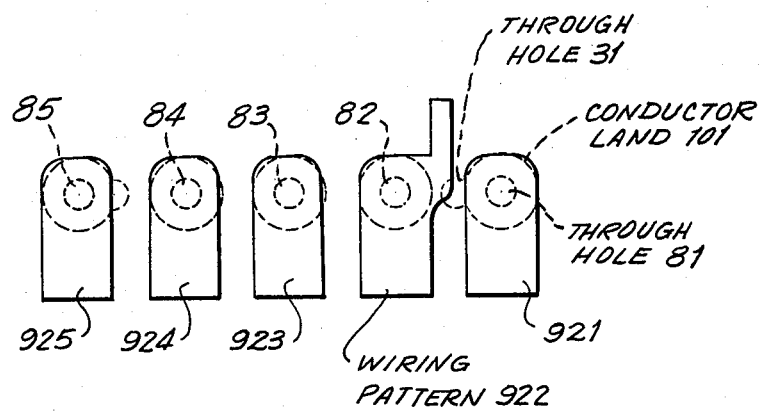

FIG. 12e shows the conductor lands 101, 102, 103, 104 and 105 formed by evaporation after the sintering of the green sheet at the same position as that of the conductor land shown in FIG. 12a on the substrate where the through holes 31, 32, 33, 34 and 35 are formed. The through hole 81 is positioned and formed on the surface of the substrate on which the wiring patterns are formed, corresponding to the center of each conductor land, as shown in FIG. 12f. Then, as shown in FIG. 12g, the wiring patterns 921, 922, 923, 924 and 925 are formed. Thereby, for example, the through hole 31 is electrically insulated from the wiring pattern 922 by the insulation material of the substrate, and the overlapped area of FIG. 12g does not continue.

As hereinbefore described, in accordance with the invention, a method of manufacture of a multilayer ceramic board or plate provides a pattern for accurately mounting the elements on the board which is formed without being influenced by the displacement of the pattern due to shrinkage of the ceramic plate at the time of sintering.

FIRST EXAMPLE

A multilayer ceramic plate having the dimensions shown in Table 1 was manufactured by the following process.

TABLE 1

| | |
|---|---|
| Number of layers: | 10 |
| Diameter of through hole: | 100μ |
| Diameter of land: | 100μ |
| Minimum pitch of through hole: | 750μ |
| Size: | 100 mm × 100 mm square |

First, a binder ethyl cellulose 5.5 wt %, a plasticizer dibutylphthlate 10 wt %, and a thinner terpineol 50 wt % were added to 95% aluminum powder 100 wt %. The mixture was milled. A green sheet having a thickness of 300μ was produced from the slip obtained by the foregoing by the use of the doctor blading method. The green was then dried in air for 24 hours and was drilled in the dimensions shown in Table 1.

Tungsten paste was obtained by milling tungsten 100 wt % having an average grain diameter of one micrometer of μm, ethylcellulose 8.0 wt %, diodylphthlate 4.0 wt %, terpineol 25.0 wt % and n-butylcarbitolacetate 25.0 wt %.

The holes of the green sheet were filled with the tungsten paste. Simultaneously, a wiring pattern was formed by printing the tungsten paste on the substrate in accordance with a predetermined pattern. In the same manner, ten green sheets were provided, on which the pattern of conductive material was formed.

The ten ceramic green sheets thus obtained were then laminated at a pressure of about 3 kg/mm$^2$ and a temperature of 80° C. to 90° C. The multilayer ceramic board was sintered for an hour in a hydrogen ambient at 1540° C. At such time, the average concentration coefficient due to sintering of the plates thus obtained was 16.5%. However, deviation of the concentration coefficient was excellent and was not ±0.4% even under the well controlled condition. Therefore, displacement of the through hole at the position spaced about 45 mm from the center of the multilayer ceramic plate was a maximum of +180 microns or μ.

The wiring pattern for mounting elements was formed on the substrate with a minimum pitch of 750μ. Even when the gold conductor land having a surface land diameter of 100μ was vacuum evaporated on the substrate surface, there was no wiring pattern not connected to the land and no unwanted termination between them.

SECOND EXAMPLE

As hereinbefore mentioned, a multilayer ceramic plate with 10 laminations and the dimensions shown in Table 2 was manufactured by the following process.

TABLE 2

| | |
|---|---|
| Number of layers: | 10, where, only the land is formed on the outer or front surface of the outermost plate |
| Through hole diameter: | 100μ |
| Diameter of the land on the outer or front surface: | 600μ |
| Minimum pitch of through hole: | 750μ |
| Size: | 100 mm × 100 mm square |

In the case of the second example, the displacement of the pattern from the center of the plate was about +180 microns or μ.

A glass paste, which is a low temperature sealing glass ECLN04009 made by Electro-Science Laboratories was then printed on the ceramic plate bo at a thickness of 50μ. The glass paste was sinterable even in a hydrogen ambient. Since the conductor was 25μ thick at such time, the thickness of the glass layer on the land became approximately 25μ.

Then a ceramic plate ao having the dimensions shown in Table 3, was placed over the ceramic plate bo. An aluminum plate having a thickness of 5 mm and the same size as the plate was also placed over the ceramic plate bo. The plates were heated in a hydrogen ambient at 400° C. thereby integrating the ceramic plate into a single unit.

The multilayered substrate was then dipped into etching fluid or fluoric or hydrofluoric acid for the purpose of etching the glass of the drilled area.

A land conductor, hereinafter indicated in Table 3 was provided after about 25 minutes at a temperature of 30° C.

TABLE 3

| | |
|---|---|
| Plate thickness: | 250μ |
| Diameter of drilled hole: | 100μ drilled by YAG laser |
| Minimum pitch of drilling: | 750μ |
| Size: | 100 mm × 100 mm square |

The position of the through hole on the plates ao and bo was checked. That is, it was determined whether or not a drilled hole of the plate ao was in the land of the plate bo. This check clearly confirmed the conductor land area of the plate bo at the end of the plate. The drilled hole of the plate ao was then filled with gold conductor of the Dupont Company, No. 9588, and sintered in a hydrogen ambient. The through hole was thus formed. Finally, NiCr - Au was evaporated in position, followed by coating of the photo-resist and etching. An accurate and minute pattern was thereby obtained without deviation of the pattern due to fluctuation or shrinkage.

When a ceramic which may be sintered at a low temperature is used as the plate ao such as, for example, the new crystallizable glass dielectric composition No. 9492 of the Dupont Company, the plates ao and bo may be laminated into a unit at 800° C. without the use of glass paste between said plates. At such time, shrinkage on the plate ao may be made very small.

While the invention has been described by means of specific examples and in a specific embodiment, we do not wish to be limited thereto, for obvious modifications will occur to those skilled in the art without departing from the spirit and scope of the invention.

We claim:

1. A method of manufacture of a multilayer ceramic board having a fine wiring pattern on its surface and internal multilayered wiring, said method comprising the steps of forming a hole in a first ceramic plate which has been fired, forming a land layer devoid of wiring patterns, except the land, which is large enough to compensate for shrinkage due to firing on the surface of a second unfired ceramic plate having internal multilayered wiring, the land being formed at a position corresponding to the position of the through hole in the first ceramic plate, firing the second ceramic plate, laminating the first and second ceramic plates, and electrically connecting the through hole of the first ceramic plate and the land of the second ceramic plate.

2. A method of manufacture of a multilayer ceramic board as claimed in claim 1, further comprising the steps of
providing a multilayered ceramic green sheet having a surface,
forming a through hole through the green sheet, and
providing a conductive land on the surface of the multilayered ceramic green sheet to provide the second unfired ceramic plate.

3. A method of manufacture of a multilayer ceramic board as claimed in claim 1, further comprising the steps of
providing a glass layer on the second fired ceramic plate,
laminating the second fired ceramic plate and the first ceramic plate to provide a laminated board, and
melting the glass layer.

4. A method of manufacture of a multilayer ceramic board as claimed in claim 1, further comprising the steps of
providing a glass layer on the second fired ceramic plate,
etching the glass layer with the first ceramic plate having the hole therein used as a mask, and
filling the hole formed in the first ceramic plate with electrically conductive paste to provide a laminated fired ceramic board.

5. A method of manufacture of a multilayer ceramic board as claimed in claim 1, further comprising the steps of
providing a glass layer on the second fired ceramic plate with a thickness equal to that of the conductive land on the second fired ceramic plate,
laminating the first ceramic plate with the second fired ceramic plate, and
melting the glass layer to provide a laminated fired ceramic board.

6. A method of manufacture of a multilayer ceramic board as claimed in claim 1, further comprising the steps of
providing a glass layer on the second fired ceramic plate with a thickness equal to that of the conductive land of the second ceramic plate,
laminating the first ceramic plate and the second fired ceramic plate having the holes therein with the holes positioned in face to face relation with the conductive land,
filling electrically conductive paste in the holes to electrically connect the second fired ceramic plate to the first ceramic plate,
heating the laminated ceramic plate, and
firing the electrically conductive paste to melt the glass layer and to provide a laminated fired ceramic board.

7. A method of manufacture of a multilayer ceramic board as claimed in claim 1, further comprising the steps of
providing an unfired ceramic green sheet having holes as the first ceramic plate,
providing a glass layer on the second fired ceramic plate with a thickness equal to that of the conductive land on the second fired ceramic plate,
laminating the second fired ceramic plate with the glass layer and the ceramic green sheet to provide a laminated fired ceramic board,
filling electrically conductive paste in the holes formed in the laminated plate to electrically connect the second fired ceramic plate and the ceramic green sheet,
heating the plate with the electrically conductive paste in the holes thereof to the firing temperature of the ceramic green sheet, and
simultaneously firing the ceramic green sheet, the electrically conductive paste and the glass layer.

8. A method of manufacture of a multilayer ceramic board as claimed in claim 1, further comprising the steps of
providing a ceramic green sheet having holes as the first ceramic plate,
providing the ceramic green sheet on the second fired ceramic plate, and
heating the plate on which the ceramic green sheet is formed to the firing temperature of the ceramic green sheet to provide a laminated fired ceramic board.

9. A method of manufacture of a multilayer ceramic board as claimed in claim 2, further comprising the steps of
applying an electrically conductive paste to the surface of the ceramic green sheet,
printing the electrically conductive paste to form the wired layer, and
forming a layer having the through hole on the wired layer alternately to provide the multilayered ceramic green sheet.

10. A method of manufacture of a multilayer ceramic board as claimed in claim 2, further comprising the steps of
applying an electrically conductive paste to the surface of the multilayered ceramic green sheet,
printing a predetermined land pattern on the conductive paste, and
firing the ceramic green sheet and the predetermined land pattern of electrically conductive paste on the surface thereof to provide the conductive land.

11. A method of manufacture of a multilayer ceramic board as claimed in claim 2, further comprising the steps of
firing the multilayered ceramic green sheet,
applying an electrically conductive paste to the surface of the multilayered ceramic green sheet after firing, and
printing a predetermined land pattern on the conductive paste to provide the conductive land.

12. A method of manufacture of a multilayer ceramic board as claimed in claim 2, further comprising the steps of
providing a plurality of ceramic green sheets each having a surface, a wiring layer of a predetermined pattern on the surface and a through hole in the surface,
printing a conductive pattern on the ceramic green sheets, and
printing a reverse pattern to the conductive pattern, consisting of insulating material, on the ceramic green sheets to provide a dielectric pattern.

13. A method of manufacture of a multilayer ceramic board as claimed in claim 3, further comprising the step of
providing the glass layer with a thickness greater than that of the conductive land on the second fired ceramic plate.

14. A method of manufacture of a multilayer ceramic board as claimed in claim 3, further comprising the steps of providing the glass layer with a thickness greater than that of the conductive land on the second fired ceramic plate,
providing a ceramic green sheet as the first ceramic plate,
melting the glass layer, and
heating the first ceramic plate at firing temperature to integrate the second fired ceramic plate and the first ceramic plate.

15. A method of manufacture of a multilayer ceramic board as claimed in claim 3, further comprising the steps of
providing the glass layer with a thickness greater than that of the conductive land on the second fired ceramic plate, the first ceramic plate being the fired ceramic plate, and
heating the glass layer at a temperature sufficient to soften it to provide a laminated fired ceramic board.

* * * * *